(12) United States Patent
Lin et al.

(10) Patent No.: US 8,709,105 B2
(45) Date of Patent: Apr. 29, 2014

(54) ELECTRODES AND THEIR FABRICATION METHODS AS WELL AS APPLICATIONS

(75) Inventors: Chuen-Chang Lin, Douliou (TW); Jhang-Hao Jhan, Douliou (TW)

(73) Assignee: National Yunlin University of Science & Technology, Douliou (TW)

( * ) Notice: Subject to any disclaimer, the term of this patent is extended or adjusted under 35 U.S.C. 154(b) by 154 days.

(21) Appl. No.: 13/424,457

(22) Filed: Mar. 20, 2012

(65) Prior Publication Data

US 2013/0250483 A1    Sep. 26, 2013

(51) Int. Cl.
*H01G 9/00* (2006.01)
(52) U.S. Cl.
USPC ........................................... 29/25.03
(58) Field of Classification Search
None
See application file for complete search history.

(56) References Cited

U.S. PATENT DOCUMENTS

| | | | |
|---|---|---|---|
| 2005/0107870 A1* | 5/2005 | Wang et al. | 623/1.44 |
| 2005/0263164 A1* | 12/2005 | Reddy et al. | 131/334 |
| 2006/0083948 A1* | 4/2006 | Kawaguchi et al. | 428/692.1 |

* cited by examiner

*Primary Examiner* — Seahvosh Nikmanesh
(74) *Attorney, Agent, or Firm* — Fishman & Associates, LLC

(57) ABSTRACT

An electrode including a substrate and a complex metal oxide film deposited on the surface of the substrate. The complex metal oxide film includes manganese oxide, cobalt oxide, and zinc oxide. A main component of the complex metal oxide film is manganese oxide. The stability of the electrode is enhanced by adding little amount of cobalt oxide and zinc oxide. Furthermore, a method relates to fabricate the electrode. The method utilizes a dry process, simpler one-step radio frequency magnetron sputtering to fabricate the electrode of the present invention. The process can reduce residual impurities in the electrode and then prevent the electrochemical capacitor and cell from explosion. Moreover, an electrochemical capacitor and a cell relates to of the above electrode.

9 Claims, 21 Drawing Sheets

ELECTRODES AND THEIR FABRICATION METHODS AS WELL AS APPLICATIONS

BACKGROUND OF THE INVENTION

1. Field of the Invention

The present invention relates to electrodes of electrochemical capacitors and cells, and utilizes simpler one-step radio frequency magnetron sputtering through a dry process to reduce residual impurities in the electrode and then avoid explosion. The present invention also relates to the method of fabricating electrodes for electrochemical capacitors and cells.

2. Description of the Prior Arts

In recent years, electronic industry develops vigorously; finished products tend to be light and small. Demands are eager for stored-energy elements with high power density, high energy density, reversibility and long cycle life. The conventional capacitor mainly uses electric double layers to store charges, and has the characteristic of longer cycle life. For both low energy-storage and short discharge, their applications are limited. The secondary battery could not have important breakthrough even though with quite high energy density, the long use-life (long cycle life), quick charges and high power density are limited by the electrode-surface chemical response. Thus, electrochemical capacitors, also called supercapacitors, are developed, which are a new storage element, and have the characteristics of both secondary lithium battery and the conventional capacitor. Due to high capacitance, the electrochemical capacitor is further used on mixed power sources of electro-vehicles, emergency power supply and memory buffer. Moreover, electrochemical capacitor has the characteristic of storing large amount of energy at a short time, fast charge-discharge, long cycle life, good reversibility, and no contamination, and thus is usually applied in burst-power generation as well as acceleration tool in electric-drive vehicles, and starting power for, notebook as well as fuel cell.

The electrode materials used for electrochemical capacitor currently could be classified to three kinds: active charcoal with high specific surface area, metal oxides and conductive polymeric materials. The capacitor with electrode materials of active carbon with high specific surface area stores energy through physical absorption of charges by electric double layers on electrode surface, but is accompanied by a disadvantage of high internal resistance. The capacitor with electrode materials of metal oxides and conductive polymeric materials stores energy not only by the way as above-mentioned but also by using the charges transference on electrode surface to cause oxidation and reduction to store electrical energy, thus the capacitance of capacitor is higher than that only using the way of electric double layers. The metal oxides usually refer to transition metal oxides such as ruthenium dioxide ($RuO_2$). The transition metal oxides are common electrode material, use of which could generate pseudocapacitance to form a high capacitance. Yet the expensive cost of ruthenium dioxide limits the development of related applications of ruthenium oxides to electrode material. Many studies presently are devoted to other transition metal oxides such as manganese (Mn) oxide, cobalt (Co) oxide, and iron (Fe) oxide to replace ruthenium oxides.

Currently, the manganese oxides are applied to prepare the electrode of electrochemical capacitors in industry to replace ruthenium oxides for reducing costs. However, some residual impurities could be carried over from these wet processes such as sol-gel method or immersion method to prepare manganese metal oxide electrode materials, and these might affect electrochemical properties (such as conductance) of electrodes. During charge-discharge, the accumulating electric currents around impurities would easily produce high heat and then produce small sparks or explosion. Thus, depositing transition metal oxides by a dry process (such as sputtering) is a relatively safe method. Broughton has provided a sputtering method to deposit transition metal (*Electrochimica Acta*, 49, 4439, 2004). In said process, the thickness of transition metal oxide films could be accurately controlled by depositing manganese, which is oxidized to manganese dioxide through anodic oxidation. The mass specific capacitance of the electrodes with the films is determined to be 400 to 450 $F\ g^{-1}$ at a potential scan rate of 5 $mV\ s^{-1}$ by cyclic voltammetry. However, said process includes two stages: dry process (sputtering) and wet process (anodic oxidation), and does not test charge-discharge for a long time, and merely tests capacitance under lower potential scan rate (such as 5 $mV\ s^{-1}$).

In conclusion, there are many problems in terms of material and process in the electrodes of electrochemical capacitors and cells, which are to be overcome and improved.

SUMMARY OF THE INVENTION

To overcome the shortcomings, the objective of the present invention is to provide an electrode that is composed of manganese, cobalt, and zinc metal oxide through a dry process in a one-step radio frequency magnetron sputtering to deposit manganese, cobalt, and zinc metal oxide on the surface of graphite or silicon to form the electrode, resulting in reduction of residual impurities. By applicable proportion of the oxide film, which is composed of manganese, cobalt, and zinc metal oxide and deposited on graphite or silicon, electrochemical characteristics of the electrode could be enhanced.

The method in accordance with the present invention utilizes a dry process; simpler one-step radio frequency magnetron sputtering to fabricate the electrode, yet only reduces about 7% specific capacitance at the 8000th cycle of potential cycling. The cycle life is long and the specific capacitance is 260 to 280 $Fg^{-1}$ at a potential scan rate of 100 $mV\ s^{-1}$.

To achieve the above objective, the present invention provides an electrode including a substrate and a complex metal oxide film. The complex metal oxide film is deposited on a surface of the substrate. The complex metal oxide film includes manganese oxide, cobalt oxide, and zinc oxide. Based on the overall complex metal oxide film, the amount of manganese element of manganese oxide ranges from 65 at % to 79.2 at %; the amount of cobalt element of cobalt oxide ranges from 10.4 at % to 17.5 at %; the amount of zinc element of zinc oxide ranges from 10.4 at % to 17.5 at %.

Preferably, based on the overall complex metal oxide film, the amount of manganese element of manganese oxide is 67.2 at %; the amount of cobalt element of cobalt oxide is 16.4 at %; the amount of zinc element of zinc oxide is 16.4 at %.

Preferably, the manganese oxide of the complex metal oxide film is manganese dioxide ($MnO_2$).

Preferably, the cobalt oxide of the complex metal oxide film is tricobalt tetraoxide ($Co_3O_4$).

Preferably, the zinc oxide of the complex metal oxide film is zinc oxide (ZnO).

Preferably, the substrate is composed of graphite or silicon.

The present invention provides a method of fabricating an electrode, which comprises the following steps:

providing a complex metal oxide target, wherein the complex metal oxide target is composed of manganese oxide, cobalt oxide and zinc oxide and based on the overall complex metal oxide film, the amount of manganese element of manganese oxide ranges from 65 at % to 79.2 at %; the amount of cobalt element of cobalt oxide ranges from 10.4 at % to 17.5 at %; the amount of zinc element of zinc oxide ranges from 10.4 at % to 17.5 at %;

providing a substrate;

heating the substrate to a temperature between 200° C. and 600° C.; applying a bias potential to the heated substrate; forming a complex metal oxide film on a surface of the substrate by radio frequency magnetron sputtering under a sputtering time, a sputtering power, a sputtering pressure and a volume flow rate of oxygen to form the electrode in accordance with the present invention, wherein the substrate bias potential is between 0 voltage (V) and −100 V.

Preferably, based on the complex metal oxide target, the amount of manganese element of manganese oxide is 67.2 at %; the amount of cobalt element of cobalt oxide is 16.4 at %; the amount of zinc element of zinc oxide is 16.4 at %.

Preferably, the manganese oxide of the complex metal oxide target is manganese dioxide.

Preferably, the cobalt oxide of the complex metal oxide target is tricobalt tetraoxide.

Preferably, the zinc oxide of the complex metal oxide target is zinc oxide.

Preferably, the substrate is composed of graphite or silicon.

Preferably, in the step of forming a complex metal oxide film on a surface of the substrate by radio frequency magnetron sputtering, the complex metal oxide film is deposited on a surface of the substrate by radio frequency magnetron sputtering for a sputtering time between 0.5 hour and 3 hours.

Preferably, in the step of forming a complex metal oxide film on a surface of the substrate by radio frequency magnetron sputtering, the complex metal oxide film is deposited on a surface of the substrate by radio frequency magnetron sputtering with a sputtering power between 20 W and 80 W.

Preferably, in the step of forming a complex metal oxide film on a surface of the substrate by radio frequency magnetron sputtering, the complex metal oxide film is deposited on a surface of the substrate by radio frequency magnetron sputtering at a sputtering pressure between 0.005 Torr and 0.03 Torr.

Preferably, in the step of forming a complex metal oxide film on a surface of the substrate by radio frequency magnetron sputtering, the complex metal oxide film is deposited on a surface of the substrate by radio frequency magnetron sputtering at a volume flow rate of oxygen between 0 sccm and 7.5 sccm.

The present invention also provides an electrochemical capacitor, which includes said electrode.

The present invention further provides a cell, which includes said electrode.

Based on the above-mentioned, the present invention, in comparison with the prior art, has the following advantages:

1. The complex metal oxide of the present invention includes manganese oxide. It is cheaper and has more oxidation valence numbers, thus having good capacitive characteristics as the electrode material for the electrochemical capacitor.

2. The substrate in accordance with the present invention is composed of graphite or silicon. The capacitive characteristics of the electrode, which is prepared from complex metal oxide and substrate, could be enhanced due to high specific surface area and conductivity of graphite or silicon.

3. In the present invention, in addition to manganese oxide as the main material of complex metal oxide film, cobalt oxide and zinc oxide are used to modify the electrode material. Cobalt oxide could enhance the stability of electrode. Furthermore, zinc oxide is cheap and capable of enhancing the stability of electrode.

4. The present invention utilizes radio frequency magnetron sputtering to prepare electrodes. Because radio frequency magnetron sputtering is a dry process, it could reduce residual impurities in the electrode to avoid accumulating electric currents around the impurities and then producing high heat, small sparks, as well as even explosion for the electrochemical capacitor or cell.

5. The process in accordance with the present invention could obtain the film electrode that is porous and has high surface roughness by changing the volume flow rate of oxygen, sputtering pressure, sputtering power, sputtering time, substrate temperature and bias potential. Thus, as known from the above-mentioned, the present invention could effectively solve the drawbacks of prior art and possess practicability, and thus is advantageous for relating application and development of the property.

Other objectives, advantages and novel features of the invention will become more apparent from the following detailed description when taken in conjunction with the accompanying drawings.

DETAILED DESCRIPTION OF THE PREFERRED EMBODIMENTS

Figure 1A:
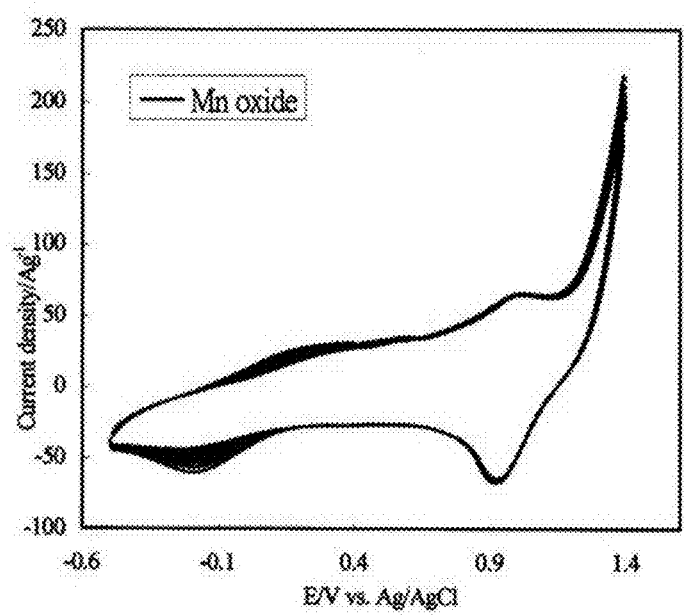
FIGS. 1A to 1E illustrate the cyclic voltammograms of manganese oxide electrodes, manganese-cobalt oxide electrodes and manganese-cobalt-zinc oxide electrodes of sample 1, sample 5 and sample 7 prepared from the examples of the present invention.

The present invention provides an electrode of the electrochemical capacitor and cell, which includes a substrate and a complex metal oxide film. The complex metal oxide film is deposited on the surface of the substrate. The said substrate is composed of graphite or silicon (Si). The said complex metal oxide film comprises transition metal oxides, and the transition metal oxides include manganese oxide, cobalt oxide and zinc oxide, wherein based on the overall complex metal oxide film, the amount of manganese element of manganese oxide ranges from 65 at % to 79.2 at %; the amount of cobalt element of cobalt oxide ranges from 10.4 at % to 17.5 at %; the amount of zinc element of zinc oxide ranges from 10.4 at % to 17.5 at %. In the complex metal oxide film of the present invention, the manganese oxide is manganese dioxide ($MnO_2$) or alternatives of manganese oxides; the cobalt oxide is tricobalt tetraoxide ($Co_3O_4$) or alternatives of cobalt oxides; the zinc oxide is zinc oxide (ZnO) or alternatives of zinc oxides.

Moreover, the present invention provides a method of fabricating an electrode, which comprises the following steps:

providing a complex metal oxide target, wherein the complex metal oxide target is composed of manganese oxides, cobalt oxides and zinc oxides, and based on the overall complex metal oxide film, the amount of manganese element of manganese oxide ranges from 65 at % to 79.2 at %; the amount of cobalt element of cobalt oxide ranges from 10.4 at % to 17.5 at %; the amount of zinc element of zinc oxide ranges from 10.4 at % to 17.5 at %. In the complex metal oxide film of the present invention, the manganese oxide is manganese dioxide ($MnO_2$) or alternatives of manganese oxides; the cobalt oxide is tricobalt tetraoxide ($Co_3O_4$) or alternatives of cobalt oxides; the zinc oxide is zinc oxide (ZnO) or alternatives of zinc oxides;

providing a substrate composed of graphite or silicon.

heating the substrate to a temperature between 200° C. and 600° C., applying a bias potential to the heated substrate; depositing complex metal oxide target on the surface of the substrate by radio frequency magnetron sputtering to form the electrode in accordance with the present invention, wherein the bias potential is between 0 voltage (V) and −100 V.

In a preferred embodiment of the present invention, said parameters of the radio frequency magnetron sputtering are as following said; but not limited to: (1) the substrate bias potential: 0V, −50V and −100V; (2) the substrate is not heated, or heated to a heating temperature of 200° C., 300° C., 400° C., 500° C. or 600° C. (3) sputtering time: 0.5 hour, 1 hour, 2 hours and 3 hours; (4) sputtering power: 20 W, 40 W, 60 W and 80 W; (5) sputtering background pressure (the pressure of vacuum chamber before sputtering process): $7 \times 10^{-6}$ Torr; (6) sputtering pressure: 0.005 Torr, 0.01 Torr, 0.02 Torr and 0.03 Torr; (7) sputtering gas and the volume flow rate of gas: the volume flow rate of argon is maintained at 25 sccm and the volume flow rates of oxygen are maintained at 0 sccm, 2.5 sccm, 5 sccm and 7.5 sccm, respectively.

The present invention also provides an electrochemical capacitor and cell, including the above-mentioned electrode of the electrochemical capacitor and cell.

The present invention is further illustrated by the following examples; it should be understood that the examples and embodiments described herein are for illustrative purposes only and should not be construed as limiting the embodiments set forth herein.

Example 1

Preparation of the Substrate

A graphite foil or Si substrate was prepared, wherein the area measurement was 1×1 or 1×2 cm². Take graphite foil for example, in mechanical polishing, the graphite foil was abraded with SiC paper and then rinsed ultrasonically with de-ionized water for 10 minutes. In order to increase its surface roughness, the graphite foil after being mechanically polished was then etched in 6 M aqueous HCl at room temperature for 30 minutes and subsequently rinsed ultrasonically with de-ionized water for 10 minutes. Next, the graphite foil after being etched was degreased ultrasonically in acetone until any surface grease was completely eliminated and rinsed with pure de-ionized water. However, the Si was degreased ultrasonically in acetone until any surface grease was completely eliminated, rinsed with pure de-ionized water. Subsequently the graphite foil or Si was oven-dried in air (50° C.) to constant weight. Finally, sputter cleaning with argon for 30 minutes was applied to form the substrate.

Example 2

Preparation of the Electrode

Sample 1: A Mn—Co—Zn oxide (99.9 wt %, melting point: about 817° C., purchased from SCM, Inc, USA) was prepared as the target in a vacuum chamber with a background pressure of $7 \times 10^{-6}$ Torr, sputtering time was 1 hour; sputtering power was 60 W; sputtering pressure was 0.02 Torr; the volume of the oxygen was 5 sccm, the distance between the target and the substrate was 8 cm; the bias potential was 0 V and the substrate was not heated. Radio frequency magnetron sputtering was used to deposit complex metal oxide on the surface of the substrate to form a complex metal oxide film, and the obtained electrode was indicated as sample 1.

Sample 2: The substrate was heated to 200° C., the remaining steps were like the steps of sample 1, and the obtained electrode was indicated as sample 2.

Sample 3: The substrate was heated to 300° C., the remaining steps were like the steps of sample 1, and the obtained electrode was indicated as sample 3.

Sample 4: The substrate was heated to 400° C., the remaining steps were like the steps of sample 1, and the obtained electrode was indicated as sample 4.

Sample 5: The substrate was heated to 500° C., the remaining steps were like the steps of sample 1, and the obtained electrode was indicated as sample 5.

Sample 6: The substrate was heated to 600° C., the remaining steps were like the steps of sample 1, and the obtained electrode was indicated as sample 6.

Sample 7: The substrate was heated to 500° C., and −50V bias potential was provided to the substrate, the remaining steps were like the steps of sample 1, and the obtained electrode was indicated as sample 7.

Sample 8: The substrate was heated to 500° C., and −100V bias potential was provided to the substrate, the remaining steps were like the steps of sample 1, and the obtained electrode was indicated as sample 8.

Sample 9: The substrate was heated to 200° C., and 0 V bias potential was provided to the substrate, the resting steps were like the steps of sample 1, and the obtained electrode was indicated as sample 9.

Sample 10: The substrate was heated to 200° C., and −50 V bias potential was provided to the substrate, the remaining steps were like the steps of sample 1, and the obtained electrode was indicated as sample 10.

Sample 11: The substrate was heated to 200° C., and −100 V bias potential was provided to the substrate, the remaining steps were like the steps of sample 1, and the obtained electrode was indicated as sample 11.

Example 3

Analysis of the Electrochemical Characteristics of the Electrode

1. The Charge-Discharge Cycle Test by Cyclic Voltammetry

The three-electrode cell consisted of the Ag/AgCl electrode served as the reference electrode, Pt as the counter electrode and electrodes prepared in sample 1 to sample 8 respectively as the working electrodes. The cyclic voltammetric measurement was performed by an electrochemical analyzer (CH Instruments CHI 608B, USA). The electrolytes were placed in a solution and degassed with purified nitrogen gas before voltammetric measurements. The solution temperature was maintained at 25° C. by means of a circulating water thermostat (HAAKE DC3 and K20, Germany). The cyclic voltammetry (CV) was taken in a 0.5 M aqueous electrolyte (LiCl, pH=6.7) at a scan rate of 100 mV $s^{-1}$. The potential window in the range of 0 to 1 V was used in all measurements unless otherwise specified. Capacitance was normalized as 1 g of manganese-cobalt-zinc oxide.

2. Impedance Measurement

Impedance measurement was operated at 5 mV AC amplitude with a frequency ranging from 0.01 Hz to 100 kHz. The electrolyte was a 0.5 M LiCl.

Example 4

The Analysis of the Electrode Characteristics

1. Morphological Investigations

The above-mentioned prepared sample 1 to sample 8 were respectively analyzed by field-emission-scanning electron microscopy (FE-SEM, JEOL JSM-6700F, Japan).

2. Oxidation State Investigations

The above-mentioned prepared sample 1 to sample 8 were respectively analyzed to figure out the oxidation state and valence number of the various samples by X-ray photoelectron spectroscopy (XPS) (Fison VG. ESCA210, England).

3. Surface Roughness Investigations

The above-mentioned prepared sample 1 to sample 8 were respectively analyzed to figure out the result and difference of surface roughness of sample 1 to sample 8 by atomic force microscope (AFM, Digital Instrument NanoMan NS4+ D3100, USA).

4. Crystalline Structure Investigations

The above-mentioned prepared sample 1 to sample 8 were respectively analyzed to figure out the crystalline structure variation by X-ray diffraction (XRD) (MAC SCIENCE, Japan).

Example 5

The Result of the Electrode Analysis

Figure 1B:
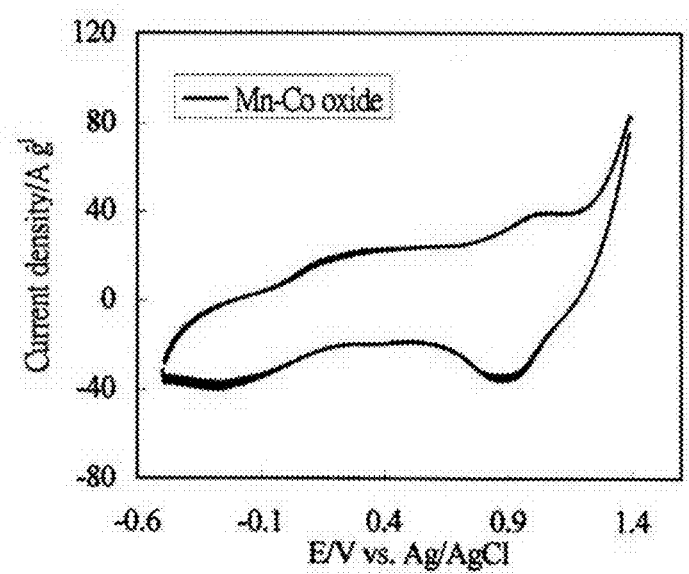
Figure 1C:
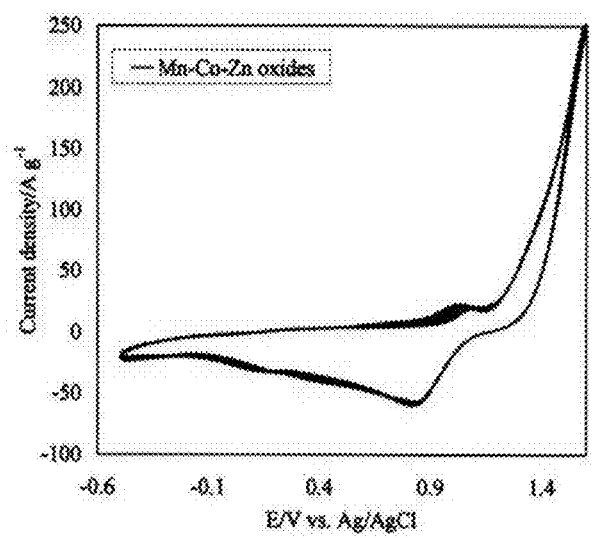
Figure 1D:
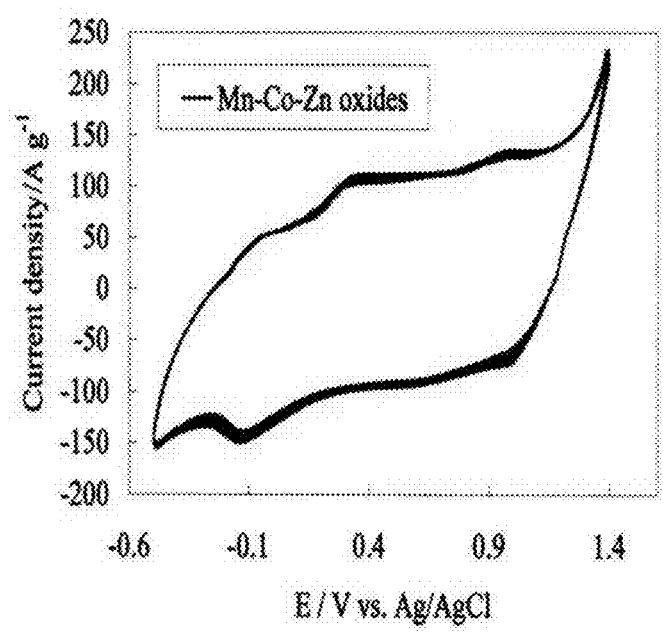
Figure 1E:
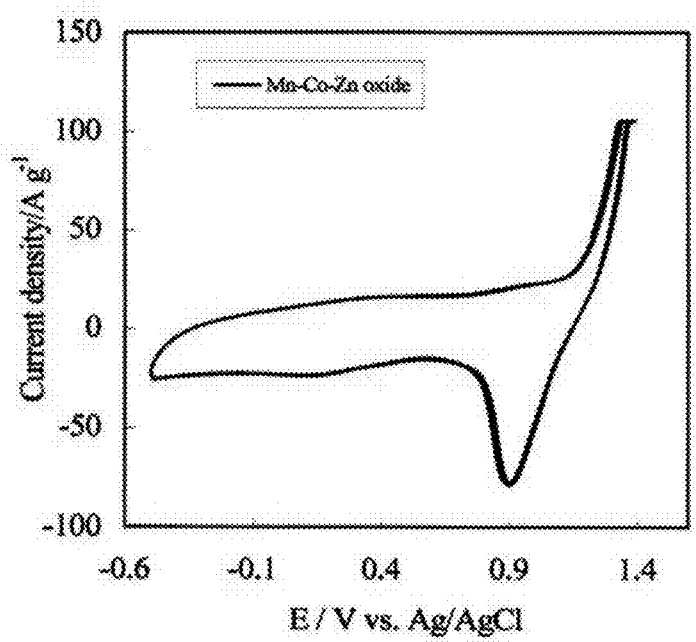

FIGS. 1A to C respectively showed the cyclic voltammograms of manganese oxide electrode, manganese-cobalt oxide electrode and manganese-cobalt-zinc oxide electrode (sample 1). From a comparison of FIGS. 1A to 1C, the stability of manganese oxide electrode could be enhanced by adding a suitable amount of cobalt oxide. Furthermore, zinc was cheaper than cobalt/manganese and the operational stability of zinc oxide was lower than that of cobalt oxide but higher than that of manganese oxide, and thus zinc oxide was added to manganese-cobalt oxide to form the manganese-cobalt-zinc oxide-composed electrode. FIGS. 1C and 1D respectively showed the cyclic voltammograms of prepared sample 1 (the substrate not heated) and sample 5 (the substrate heated to a heating temperature of 500° C.). With reference to FIGS. 1C and 1D, the capacitance of sample 5 was higher than sample 1, which illustrated the capacitance was enhanced when the substrate was heated. FIGS. 1D and 1E respectively showed the cyclic voltammograms of prepared sample 5 (0 V bias potential) and sample 7 (−50 V bias potential). As shown in FIGS. 1D and 1E, the stability of manganese-cobalt-zinc oxide can be enhanced with bias potential.

Figure 2:
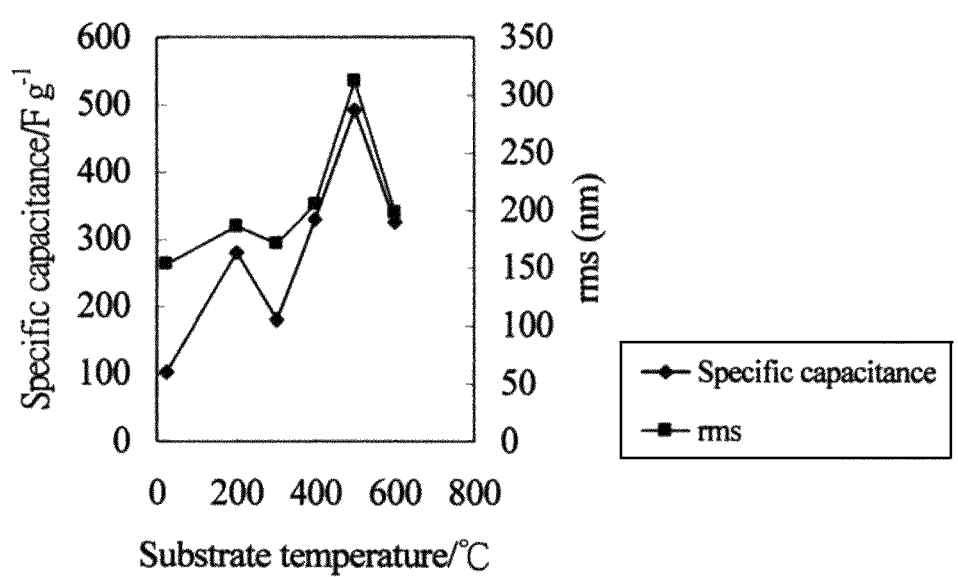
FIG. 2 illustrates the comparing results of the specific capacitance and surface roughness of sample 1 to sample 6 prepared from the examples of the present invention.
Figure 3:
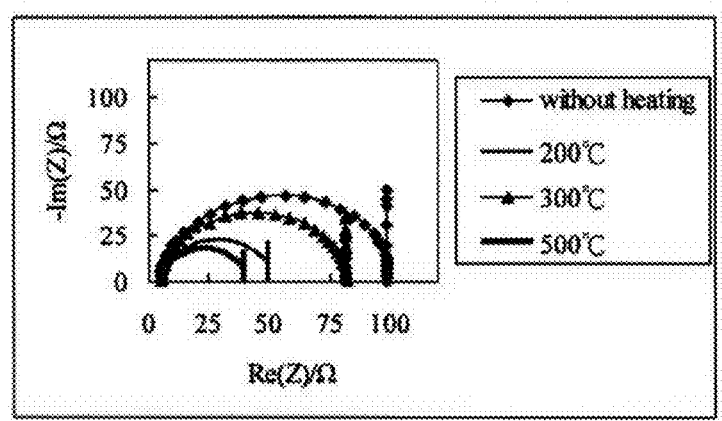
FIG. 3 illustrates the Nyquist diagrams of sample 1, sample 2, sample 3 and sample 5 prepared from the examples of the present invention.

FIG. 2 showed the comparing result of the specific capacitance and surface roughness of sample 1 to sample 6 prepared from different substrate temperatures without bias potential. FIG. 2 showed that the specific capacitance reached a maximum at a substrate treatment temperature of 500° C., and illustrated that higher surface roughness led to higher specific capacitance. FIG. 3 further showed the Nyquist diagrams of sample 1, sample 2, sample 3 and sample 5 prepared at different substrate treatment temperatures without bias potential. As shown in FIGS. 2 and 3, the lower equivalent series resistance had higher specific capacitance.

Figure 4A:
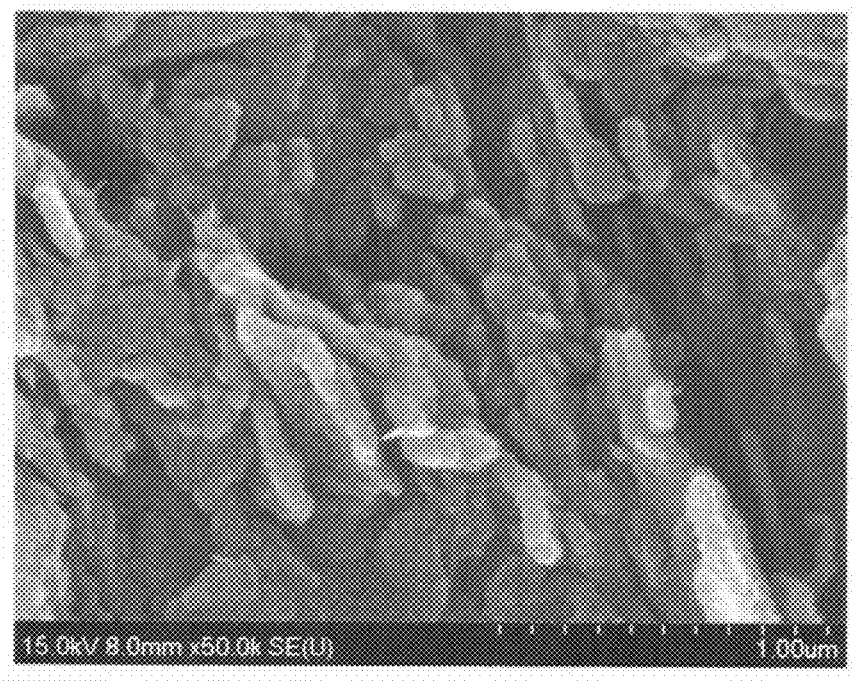
FIGS. 4A to 4F illustrate the SEM results of sample 1 to sample 6 prepared from the examples of the present invention.
Figure 4B:
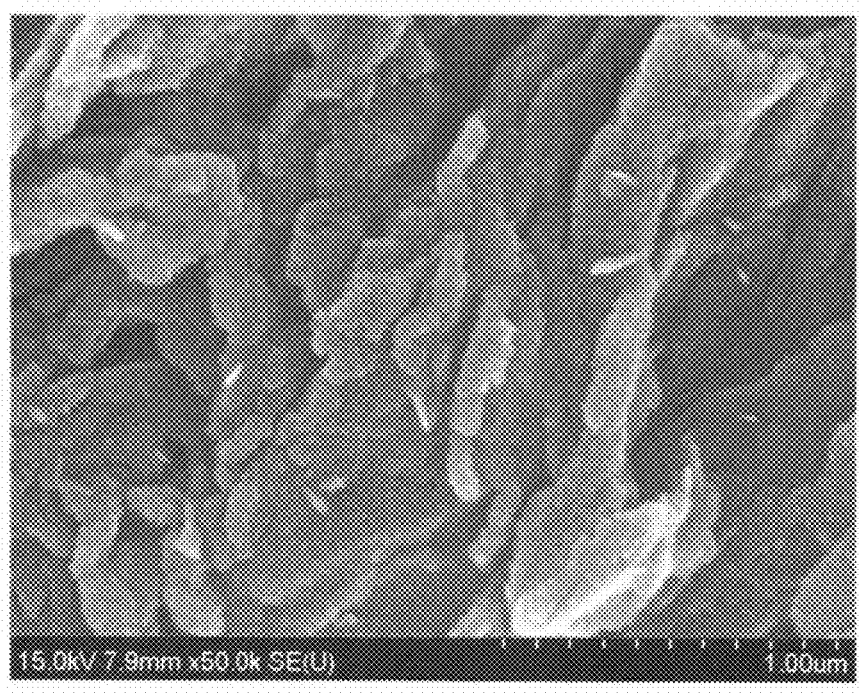
Figure 4C:
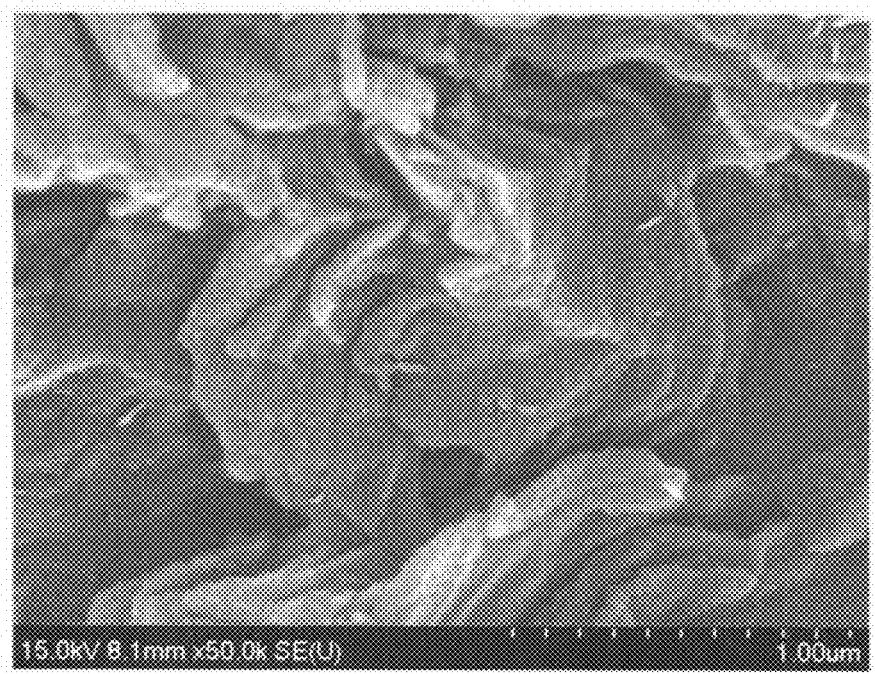
Figure 4D:
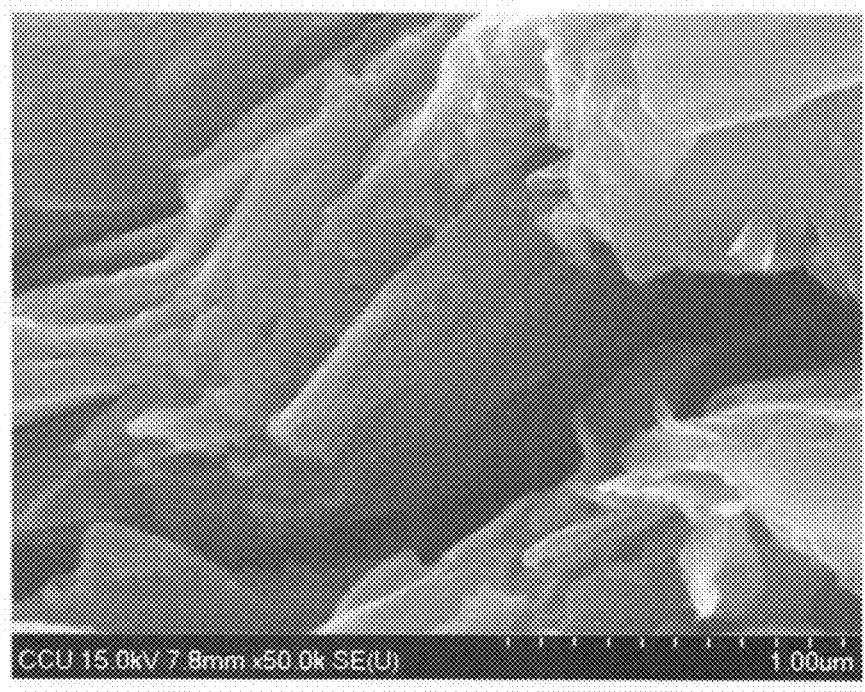
Figure 4E:
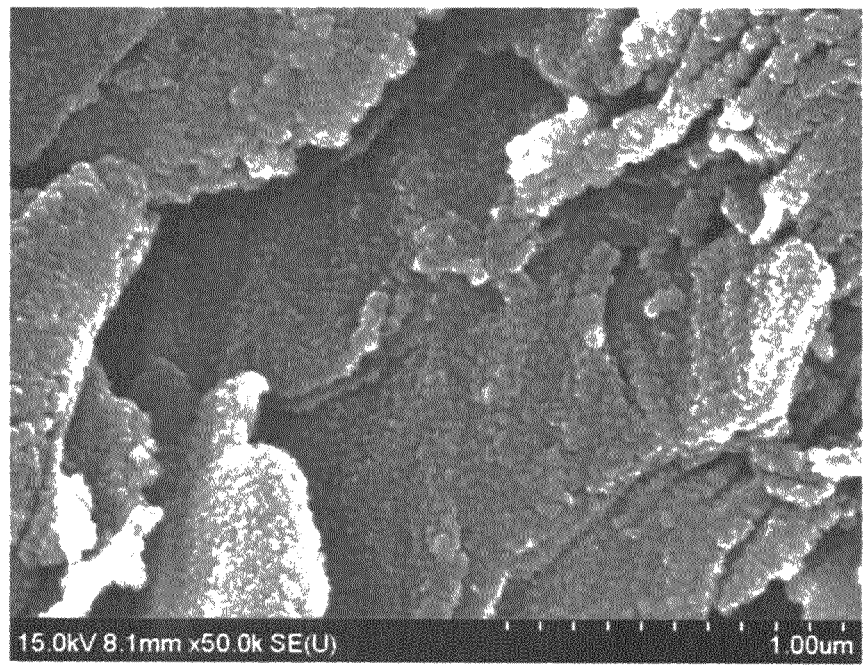
Figure 4F:
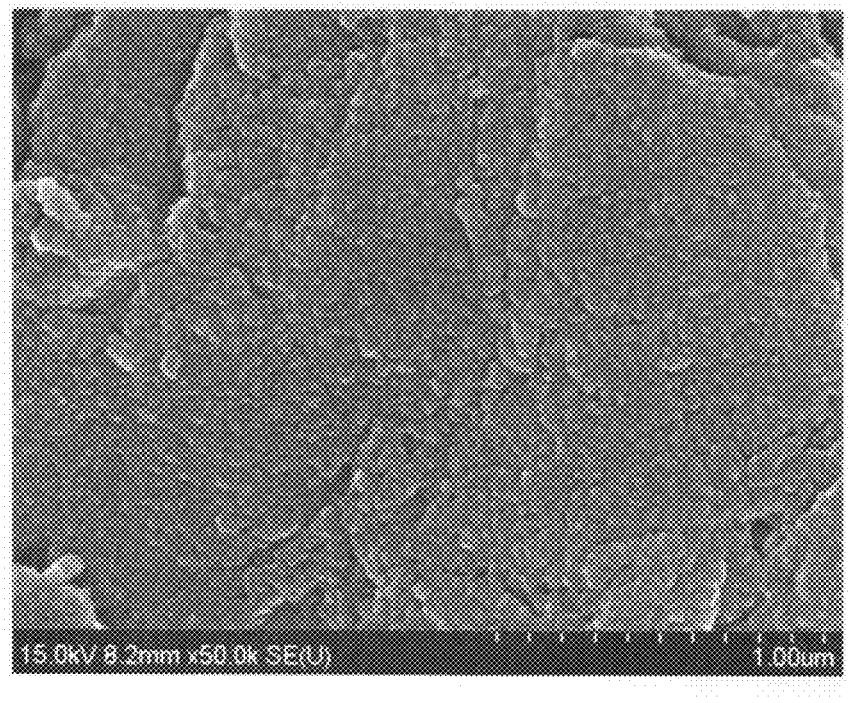

FIGS. 4A to 4F showed the SEM results of sample 1 to sample 6. In the process of preparing electrode, the structure of complex metal oxide films depended on substrate temperature/target melting point and inert sputtering gas pressure. According to the structure zone model introduced by Thornton, four zones (Zone 1, Zone T, Zone 2 and Zone 3) might be produced by sputtering complex metal oxide film deposited on target surface with different substrate treatment temperatures. FIGS. 4A to 4B showed that the microstructures of the complex metal oxide films sputtered without substrate bias potential belonged to the zone 1 structure for both without heating as well as a substrate heated to 200° C., which illustrated obvious pores, irregular array and loose sputtered film microstructure existed on the surface of the overall film because of low atom mobility with low temperature which limited dense array. For a substrate treatment temperature to be 300° C. (FIG. 4C), the microstructure of the complex metal oxide films belonged to the zone T structure, which was dense grain boundary array because surface diffusion atom accepted energy gradually to form nuclear. For a heating temperature of the substrate to be 400° C., 500° C., as well as 600° C. (FIGS. 4D to 4F), the complex metal oxide films belonged to the zone 2 structure, which had bigger grains and less pores compared to the structure of zone 1 and zone T. The adhesion, mechanical properties and electric properties of formed complex metal oxide films all could be enhanced under this substrate treatment temperature because of lower defect density within grain and increasing compactness of grain boundary. Further as shown in FIG. 4F, for the substrate treatment temperature of the substrate being 600° C., the surface structure of the complex metal oxide film deposited on substrate surface tended to form chunks and its dense grain formed a compact film.

As shown in Table 1, the average surface area density of the complex metal oxide film was proportional to the square average grain diameter and average grain density. Table 1 and FIG. 2 also indicated that the higher the average surface area density, the higher the specific capacitance.

TABLE 1

The average surface area density, average grain diameter and average grain density of sample 1 to sample 6 sputtered at different heating temperatures of substrate without bias potential.

| | Substrate treatment temperature (° C.) | Average grain diameter (nm) | Average grain density (cm$^{-2}$) | Average surface area density (nm$^2$ cm$^{-2}$) |
|---|---|---|---|---|
| Sample 1 | Without heating | 25.26 | $1.2 \times 10^{11}$ | $2.40 \times 10^{14}$ |
| Sample 2 | 200 | 25.64 | $1.4 \times 10^{11}$ | $2.89 \times 10^{14}$ |
| Sample 3 | 300 | 26.06 | $1.2 \times 10^{11}$ | $2.56 \times 10^{14}$ |
| Sample 4 | 400 | 49.02 | $5.0 \times 10^{10}$ | $3.77 \times 10^{14}$ |
| Sample 5 | 500 | 42.99 | $8.0 \times 10^{10}$ | $4.64 \times 10^{14}$ |
| Sample 6 | 600 | 43.99 | $6.0 \times 10^{10}$ | $3.65 \times 10^{14}$ |

Figure 5:
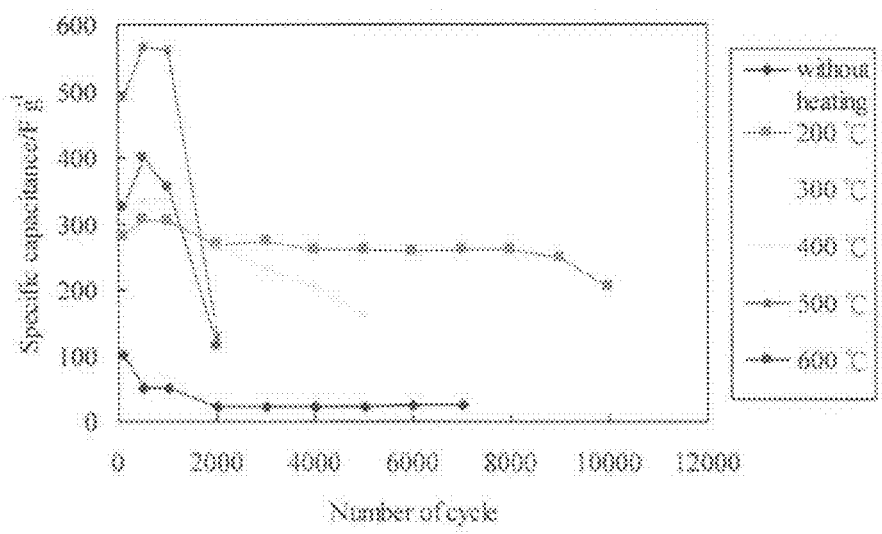
FIG. 5 illustrates the comparing results of charge-discharge cycle test by cyclic voltammetry of sample 1 to sample 6 prepared from the examples of the present invention.

FIG. 5 showed the compared result of charge-discharge test by cyclic voltammetry of sample 1 to sample 6. FIG. 5 showed that long-term operational stability (specific capacitance only reduced by about 7% at the 8000th cycle by cyclic voltammetry) and good specific capacitance at a substrate treatment temperature of 200° C. (sample 2).

Figure 6:
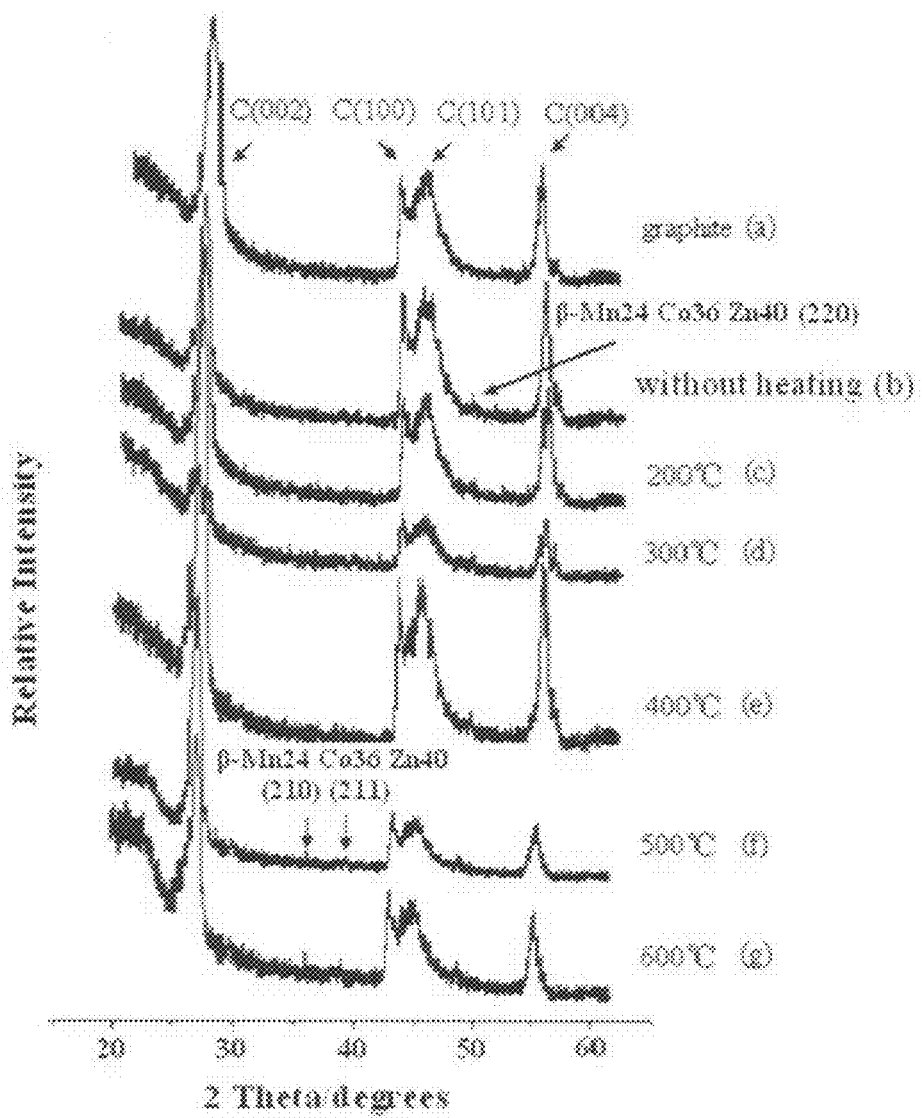
FIG. 6 illustrates the X-ray diffraction (XRD) patterns of the freshly polished graphite foil and sample 1 to sample 6 prepared from the examples of the present invention.

FIG. 6 showed the X-ray diffraction (XRD) patterns of the freshly polished graphite foil and the above-prepared sample 1 to sample 6, wherein the graphite foil worked as control group for recognition of carbon crystal peaks [see FIG. 6(*a*)]. FIG. 6 showed that major intensity peak patterns of sample 1 to sample 6 were the same as those of graphite foil, with one more lower intensity peak at 2θ=48° position of sample 1 to sample 6, which was contributed from deposited β-Mn$_{24}$Co$_{36}$Zn$_{40}$ (220) [see FIGS. 6(*b*) to 6(*g*)], and two more intensity peaks at 2θ=36° and 2θ=38° positions of sample 5 to sample 6, which were respectively contributed from deposited β-Mn$_{24}$Co$_{36}$Zn$_{40}$ (210) and β-Mn$_{24}$Co$_{36}$Zn$_{40}$ (211) [see FIGS. 6(*f*) to 6(*g*)]. It illustrated that the increasing substrate treatment temperature could lead noncrystalline structure to crystallitic structure. The relative intensity of the complex metal oxide thin generally increased with increasing the treatment temperature of substrate, and higher kinetic energy had higher mobility on the surface of the substrate for particles. However, capacitance values seemed non-relative to the structural properties due to poor crystallization for complex metal oxide films.

TABLE 2

The average surface area density, average grain diameter and average density of sample 5, sample 7 and sample 8 sputtered at a substrate treatment temperature of 500° C. and with different substrate bias potentials

| | Substrate bias potential (V) | Average grain diameter (nm) | Average grain density (cm$^{-2}$) | Average surface area density (nm$^2$ cm$^{-2}$) |
|---|---|---|---|---|
| Sample 5 | 0 | 42.99 | $8.0 \times 10^{10}$ | $4.64 \times 10^{14}$ |
| Sample 7 | −50 | 23.58 | $1.2 \times 10^{11}$ | $2.10 \times 10^{14}$ |
| Sample 8 | −100 | 53.04 | $4.0 \times 10^{10}$ | $1.54 \times 10^{14}$ |

Figure 7:
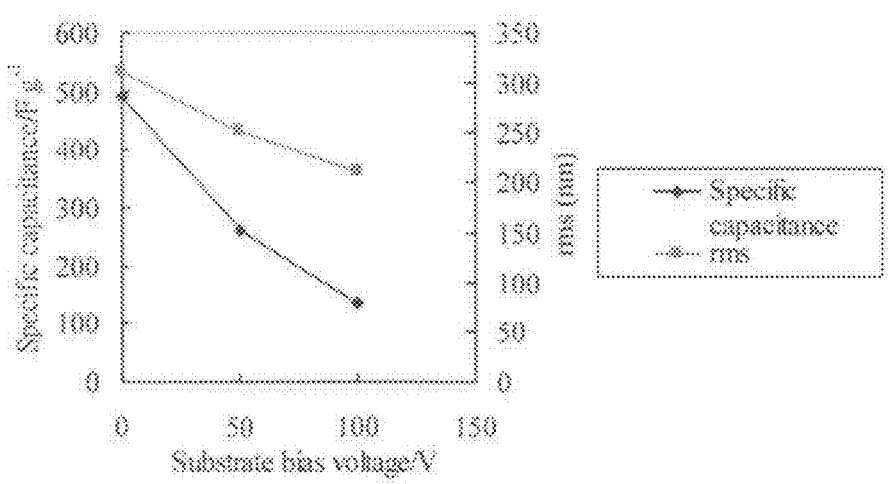
FIG. 7 illustrates the comparing results of the specific capacitance and surface roughness of sample 5, sample 7 and sample 8 prepared from the examples of the present invention.

FIG. 7 showed the compared results of the specific capacitance and surface roughness of sample 5, sample 7 and sample 8 sputtered at a heating temperature of substrate with 500° C. and with different substrate bias potentials. FIG. 7 showed that specific capacitance decreased with increasing bias potential of the substrate since higher bias potential was applied to substrate, which had higher kinetic energy and higher mobility on the surface of the substrate for particles and lower surface roughness, and thus led to lower specific capacitance. Furthermore, Table 2 and FIG. 7 also referred to that higher average surface area of the complex metal oxide film had higher specific capacitance of the electrode.

Figure 8A:
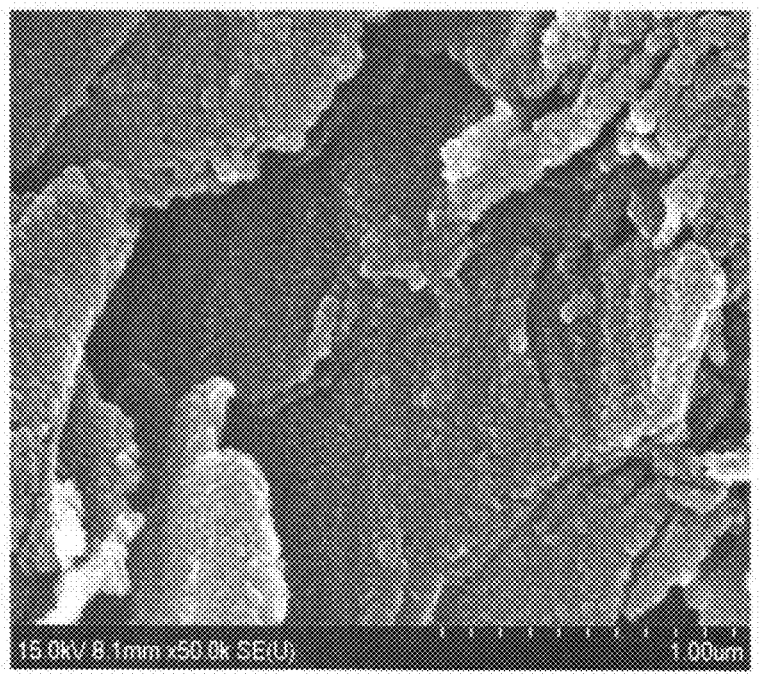
FIGS. 8A to 8C illustrate the SEM results of sample 5, sample 7 and sample 8 prepared from the examples of the present invention.
Figure 8B:
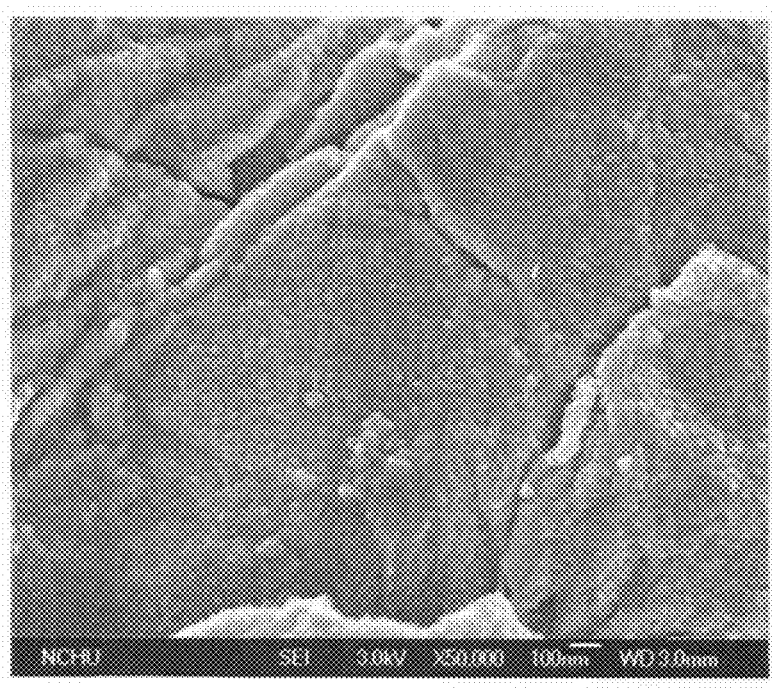
Figure 8C:
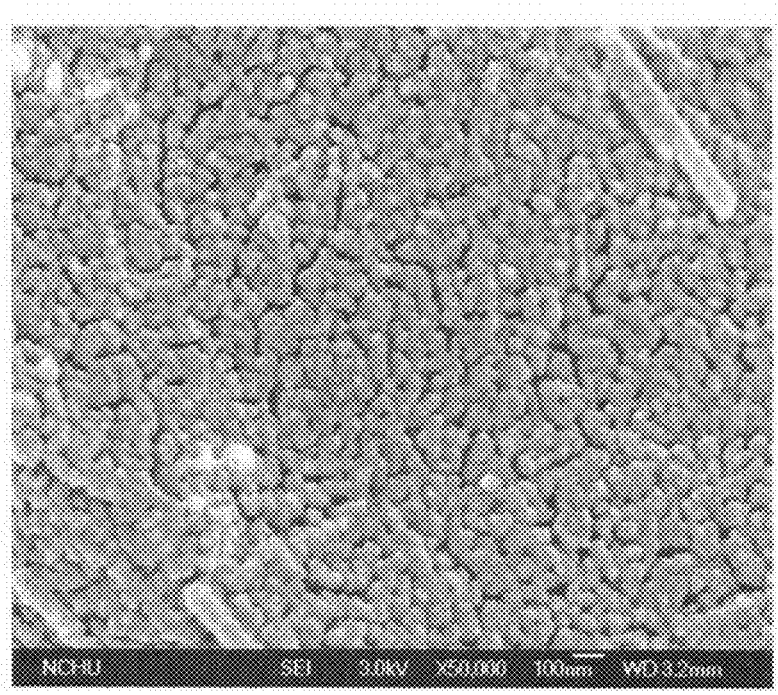

FIGS. 8A to 8C showed the SEM results of sample 5, sample 7 and sample 8 sputtered at a substrate treatment temperature of 500° C. and were respectively applied with bias potential of 0 V, −50 V and −100 V. FIG. 8 showed that compared to that without bias potential, the film with substrate bias potential of −50 V was more uniform and the film with substrate bias potential of −100 V was the densest since increasing of substrate bias potential could enhance the average energy of the bombarding ions toward the growing film, thus enhanced the adatom mobility on the surface.

Figure 9:
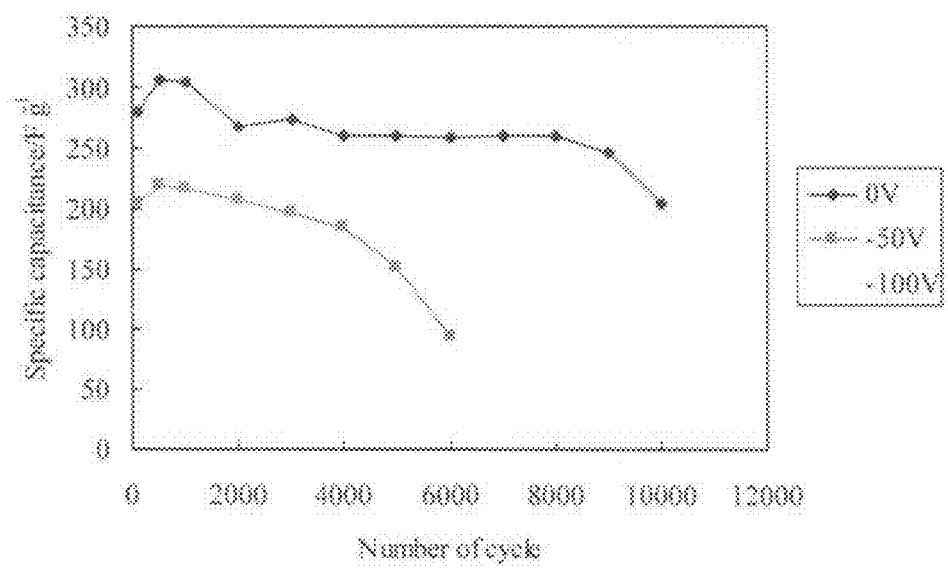
FIG. 9 illustrates the comparing results of charge-discharge test by cyclic voltammetry of sample 9, sample 10 and sample 11 prepared from the examples of the present invention.

FIG. 9 showed the compared results of charge-discharge test by cyclic voltammetry of sample 9, sample 10 and sample 11, which were sputtered at a substrate treatment temperature of 200° C. and respectively with the substrate bias potential of 0V, −50V and −100V. FIG. 9 showed better stability and good specific capacitance without substrate bias potential.

Figure 10:
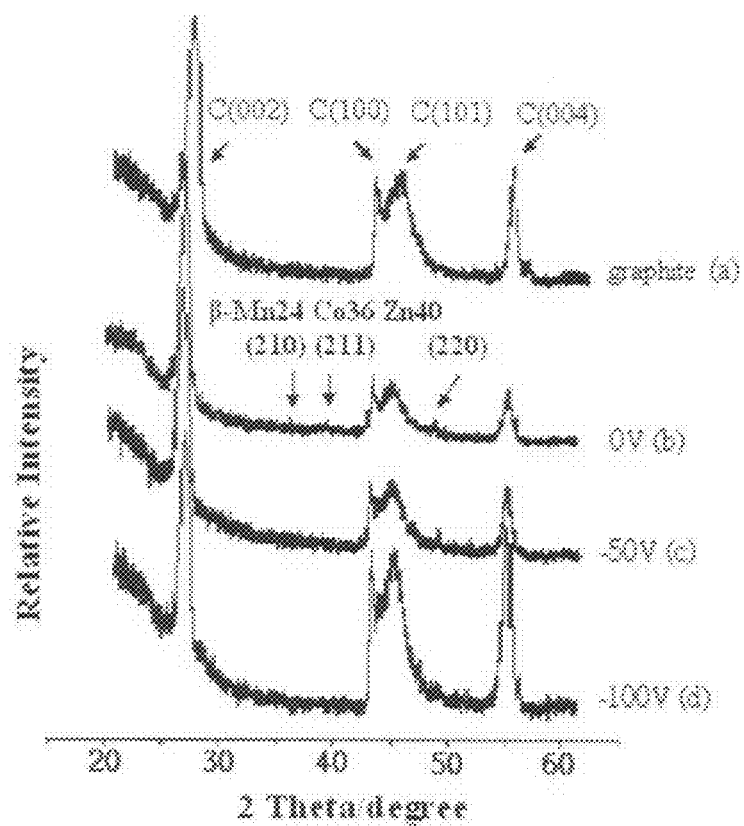
FIG. 10 illustrates the X-ray diffraction (XRD) patterns of the freshly polished graphite foil and sample 5, sample 7, as well as sample 8 prepared from the examples of the present invention.

FIG. 10 showed the X-ray diffraction (XRD) patterns of the freshly polished graphite foil and the above-prepared sample 5, sample 7, as well as sample 8, wherein the graphite foil worked as control group for recognition of carbon crystal peaks [see FIG. 10(*a*)]. FIG. 10 showed that major intensity peak patterns of sample 5, sample 7 and sample 8 were the same as those of graphite foil, with one more lower intensity peak at 2θ=48° position of sample 5, sample 7 and sample 8, which was contributed from deposited β-Mn$_{24}$Co$_{36}$Zn$_{40}$ (220) [see FIGS. 10(*b*) to 10(*d*)], and two more lower intensity peaks at 2θ=36° and 2θ=38° positions of sample 5, which were respectively contributed from deposited β-Mn$_{24}$Co$_{36}$Zn$_{40}$ (210) and β-Mn$_{24}$Co$_{36}$Zn$_{40}$ (211) [see FIGS. 6(*f*) to 6(*g*)]. It illustrated that the complex metal oxide film (manganese-cobalt-zinc oxide) deposited on substrate (graphite foil) was a lowly crystallitic structure. Further, FIGS. 10*b* to 10*d* showed that the relative intensity of intensity peak at 2θ=48° firstly increased with increasing the substrate bias potential and then decreased. Due to higher bias potential applied to the substrate, there would be higher kinetic energy and higher mobility on the surface of the substrate for particles, and thus led to higher relative intensity of intensity peak of deposited β-Mn$_{24}$Co$_{36}$Zn$_{40}$ (220). However, as bias potential of the substrate was −100 V, re-sputtering led to poorer crystallization, and thus led to lower relative intensity of β-Mn$_{24}$Co$_{36}$Zn$_{40}$ (220). Moreover, the capacitance values of the electrode also seemed non-relative to structural properties of the micro-crystal of complex metal oxide films.

In conclusion of the above-mentioned, the present invention used radio frequency magnetron sputtering to deposit manganese-cobalt-zinc oxide on graphite foil or silicon substrate, and regulated heating temperature of substrate and applied bias potential to the substrate to fabricate the electrode in accordance with the present invention. Under the parameters that the sputtering time was 60 minutes, the sputtering pressure was 0.02 Torr, the sputtering power was 60 W, the volume flow rate of oxygen was maintained at 5 sccm, the substrate treatment temperature was 200° C. and the substrate bias potential was 0 V, the specific capacitance only reduced by about 7% at the 8000th cycle of potential cycling. The cycle life span was long and the specific capacitance was 260 to 280 Fg$^{-1}$ at a potential scan rate of 100 mV s$^{-1}$.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A method of fabricating an electrode, comprising steps of:
providing a complex metal oxide target, wherein the complex metal oxide target is composed of manganese oxide, cobalt oxide and zinc oxide, and based on the overall complex metal oxide film, the amount of manganese element of manganese oxide ranges from 65 at % to 79.2 at %; the amount of cobalt element of cobalt oxide ranges from 10.4 at % to 17.5 at %; the amount of zinc element of zinc oxide ranges from 10.4 at % to 17.5 at %;
providing a substrate; and
heating the substrate to a heating temperature between 200° C. and 600° C.; applying a bias potential to the heated substrate; forming a complex metal oxide film on a surface of the substrate by radio frequency magnetron sputtering under a sputtering time, a sputtering power, a sputtering pressure and a volume flow rate of oxygen to obtain the electrode, wherein the substrate bias potential is between 0 V and −100 V.

2. The method according to claim 1, wherein the manganese oxide of the complex metal oxide film is manganese dioxide.

3. The method according to claim 1, wherein the cobalt oxide of the complex metal oxide film is tricobalt tetraoxide.

4. The method according to claim 1, wherein the zinc oxide of the complex metal oxide film is zinc oxide.

5. The method according to claim 1, wherein the substrate is composed of graphite or silicon.

6. The method according to claim 1, wherein the step of forming a complex metal oxide film on a surface of the substrate by radio frequency magnetron sputtering is processed under a condition of a sputtering time between 0.5 hour to 3 hours, a sputtering power between 20 W and 80 W, a sputtering pressure between 0.005 Torr and 0.03 Torr, and a volume flow rate of oxygen between 0 sccm and 7.5 sccm.

7. The method according to claim 1, wherein the heating temperature is 200° C., the microstructures of the complex metal oxide films sputtered without substrate bias potential belonged to the zone 1 structure.

8. The method according to claim 1, wherein the heating temperature is 300° C., the microstructure of the complex metal oxide films belonged to the zone T structure.

9. The method according to claim 1, wherein the heating temperature is between 300° C. and 600° C., the complex metal oxide films belonged to the zone 2 structure.

* * * * *